United States Patent
Hashimoto et al.

(10) Patent No.: US 9,236,276 B2
(45) Date of Patent: Jan. 12, 2016

(54) SEMICONDUCTOR DEVICE AND METHOD FOR MANUFACTURING THE SAME

(71) Applicant: DENSO CORPORATION, Kariya, Aichi-pref. (JP)

(72) Inventors: Koji Hashimoto, Obu (JP); Masamoto Kawaguchi, Kariya (JP); Masahiro Honda, Okazaki (JP); Takashige Saito, Ama (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/357,862

(22) PCT Filed: Nov. 16, 2012

(86) PCT No.: PCT/JP2012/007364
§ 371 (c)(1),
(2) Date: May 13, 2014

(87) PCT Pub. No.: WO2013/080472
PCT Pub. Date: Jun. 6, 2013

(65) Prior Publication Data
US 2014/0315356 A1    Oct. 23, 2014

(30) Foreign Application Priority Data

Dec. 1, 2011 (JP) ................................. 2011-263800

(51) Int. Cl.
*H01L 21/56* (2006.01)
*H01L 21/268* (2006.01)
(Continued)

(52) U.S. Cl.
CPC .............. *H01L 21/56* (2013.01); *H01L 21/268* (2013.01); *H01L 23/3107* (2013.01); *H01L 29/84* (2013.01); *H01L 2924/0002* (2013.01); *H01L 2924/1815* (2013.01)

(58) Field of Classification Search
CPC ............................................. H01L 2924/01014
USPC ........................... 438/123, 127; 257/E21.504
See application file for complete search history.

(56) References Cited

U.S. PATENT DOCUMENTS 6,333,564 B1 * 12/2001 Katoh et al. ................... 257/780
6,393,907 B1    5/2002 Yamakawa et al.
(Continued)

FOREIGN PATENT DOCUMENTS

JP    62267484 A    11/1987
JP    11006752 A    1/1999
(Continued)

OTHER PUBLICATIONS

International Search Report of the International Searching Authority mailed Jan. 29, 2013 for the corresponding international application No. PCT/JP2012/007364 (with English translation).
(Continued)

*Primary Examiner* — Colleen A Matthews
*Assistant Examiner* — Regan J Rundio
(74) *Attorney, Agent, or Firm* — Posz Law Group, PLC

(57) ABSTRACT

In a manufacturing method of a semiconductor device, a semiconductor chip is sealed with a resin, and then a laser is applied to remove the resin so that a part of the semiconductor chip is exposed. The semiconductor chip is made of a material that has a lower absorptivity of the laser than the resin and is not melted by the laser. The laser has a wavelength that passes through the semiconductor chip and has a lower absorptivity in the semiconductor chip than in the resin. The laser is applied to the resin from a side adjacent to one of plate surfaces of the semiconductor chip, so that the resin sealing the one of the plate surfaces is sublimated and removed and at least a part of the resin sealing the other of the plate surfaces is subsequently sublimated and removed by the laser having passed through the semiconductor chip.

8 Claims, 11 Drawing Sheets

(51) Int. Cl.
*H01L 23/31* (2006.01)
*H01L 29/84* (2006.01)

(56) References Cited

U.S. PATENT DOCUMENTS

| | | | |
|---|---|---|---|
| 6,579,376 B1 * | 6/2003 | Ikkai et al. ................. | 134/1 |
| 8,513,810 B2 * | 8/2013 | Tago ............................ | 257/762 |
| 8,604,576 B2 * | 12/2013 | Oganesian ................... | 257/432 |
| 2003/0010761 A1 | 1/2003 | Hong et al. | |
| 2009/0093425 A1 | 4/2009 | Dowdy et al. | |
| 2010/0258544 A1 * | 10/2010 | Kurita et al. ............. | 219/121.72 |
| 2011/0097584 A1 * | 4/2011 | Takahashi et al. ............ | 428/403 |
| 2012/0108013 A1 * | 5/2012 | Fujisawa et al. ............. | 438/123 |

FOREIGN PATENT DOCUMENTS

| | | | | |
|---|---|---|---|---|
| JP | 2002350387 | * | 12/2002 | ........... G01N 27/414 |
| JP | 2003-270016 A | | 9/2003 | |
| JP | 2010-101688 A | | 5/2010 | |
| JP | 2011-119500 A | | 6/2011 | |

OTHER PUBLICATIONS

Written Opinion of the International Searching Authority mailed Jan. 29, 2013 for the corresponding international application No. PCT/JP2012/007364 (with English translation).

Office Action mailed Sep. 10, 2013 in the corresponding JP Application No. 2011-263800 (with English translation).

* cited by examiner

SEMICONDUCTOR DEVICE AND METHOD FOR MANUFACTURING THE SAME

CROSS REFERENCE TO RELATED APPLICATION

The present disclosure is a U.S. national stage application of PCT/JP2012/007364 filed on Nov. 16, 2012 and is based on Japanese patent application No. 2011-263800 filed on Dec. 1, 2011, the contents of which are incorporated herein by reference.

TECHNICAL FIELD

The present disclosure relates to a semiconductor device which is made by sealing the entirety of a semiconductor chip with a resin and removing the resin, after the sealing, by applying a laser so that at least a part of the semiconductor chip is exposed, and a method for manufacturing the semiconductor device.

BACKGROUND ART

Conventionally, as a method for manufacturing such a semiconductor device, it has been proposed a method in which a plate-shaped semiconductor chip is prepared (preparing step), the entirety of the semiconductor chip is sealed with a resin (resin-sealing step), and thereafter a laser is applied to the resin so that a part of the resin applied with the laser is sublimated and removed and a part of the semiconductor chip is exposed (resin-removing step) (see Patent Literature 1).

In such a case, since the entirety of the semiconductor chip is sealed with the resin in the resin-sealing step, the cost of a mold can be reduced. For example, it is possible to seal only a part of the semiconductor chip by devising a mold, such as by changing the shape of a cavity of the mold. In such a case, however, it is necessary to arrange a film so as to avoid the resin adhering to the exposed portion of the semiconductor chip, or to shape the cavity into a specific shape. In that regard, in the case where the semiconductor chip is entirely sealed, since a general mold is used, the cost reduces.

However, when the above-described removing method, which removes the resin by sublimating the resin with the laser, is employed for the purpose of removing the resin from both plates surfaces of the semiconductor chip, both the plate surfaces of which are sealed with the resin, the resin on one of the plate surfaces is removed by applying the laser from a side adjacent to the one of the plate surfaces, and the resin on the other of the plate surfaces is removed by applying the laser from a side adjacent to the other of the plate surfaces after a step of changing the orientation of the semiconductor chip or moving the position of a laser applying device to the side adjacent to the other of the plate surfaces of the semiconductor chip.

Namely, in the conventional method, it is necessary to apply the laser separately from the side adjacent to the one of the plate surfaces of the semiconductor chip and from the side adjacent to the other of the plate surfaces of the semiconductor chip.

Such an issue similarly arises not only in the case of exposing a part of the semiconductor chip, but also in the case of exposing the entirety of the semiconductor chip by removing the resin with the laser after the semiconductor chip is entirely sealed with the resin.

PRIOR ART LITERATURE

Patent Literature

Patent Literature 1: WO2009/069577

SUMMARY OF INVENTION

It is an object of the present disclosure to provide a method of removing a resin disposed on both plate surfaces of a semiconductor chip by applying a laser only to one of the plate surfaces of the semiconductor chip, in a manufacturing method of a semiconductor device in which the semiconductor chip is sealed with the resin and then the resin is removed by applying the laser so that at least a part of the semiconductor chip is exposed, and a semiconductor device manufactured by the method.

According to an aspect of the present disclosure, a manufacturing method of a semiconductor device includes a preparing step of preparing a semiconductor chip having a plate shape, a sealing step of sealing the entirety of the semiconductor chip with a resin, and a resin-removing step of sublimating and removing the resin by applying a laser to the resin so that at least a part of the semiconductor chip is exposed. The manufacturing method further includes the following points.

In the preparing step, as the semiconductor chip, a semiconductor chip made of a material that has a lower absorptivity of the laser than the resin and is not melt by the laser is prepared. In the resin-removing step, as the laser, a laser having a wavelength that passes through the semiconductor chip and is less absorbed in the semiconductor chip than in the resin is applied. By applying the laser toward one of the plate surfaces of the semiconductor chip, the resin sealing the one of the plate surfaces is sublimated and removed. The laser is subsequently applied to pass through the semiconductor chip to the other of the plate surfaces, so that at least a part of the resin sealing the other of the plate surfaces is sublimated and removed by the laser passing through the semiconductor chip.

Accordingly, in the case where both of the plate surfaces of the semiconductor chip are exposed by removing the resin at least at a part of the semiconductor chip, the resin on the other of the plate surfaces of the semiconductor chip can be removed at least at a part by applying the laser only from a side adjacent to the one of the plate surfaces of the semiconductor chip. Therefore, the resin on both of the plate surfaces can be removed at once by applying the laser only from the side adjacent to the one of the plate surfaces.

According to a second aspect of the present disclosure, a semiconductor device includes a semiconductor chip having a plate shape, and a resin sealing a part of the semiconductor chip. The part of the semiconductor chip sealed with the resin is referred to as a first part, and a part of the semiconductor chip exposed from the resin is referred to as a second part. The second part of the semiconductor chip has a sensing portion on one of the plate surfaces. Further, an opposed portion is provided to oppose at least one of side surfaces of the second part of the semiconductor chip and the other of the plate surfaces of the second part of the semiconductor chip across a clearance. The opposed portion is provided by an extended portion of the resin sealing the first part.

In this structure, since the opposed portion covers the surface of the semiconductor chip opposed thereto, it is expected to protect this surface from foreign materials. Also, since the opposed portion is spaced from the semiconductor chip, stress due to the resin will hardly occur in the semiconductor chip.

BRIEF DESCRIPTION OF DRAWINGS

The above and other objects, features and advantages of the present disclosure will become more apparent from the following detailed description made with reference to the accompanying drawings, in which like parts are designated by like reference numbers and in which.

EMBODIMENTS FOR CARRYING OUT INVENTION

Figure 1:
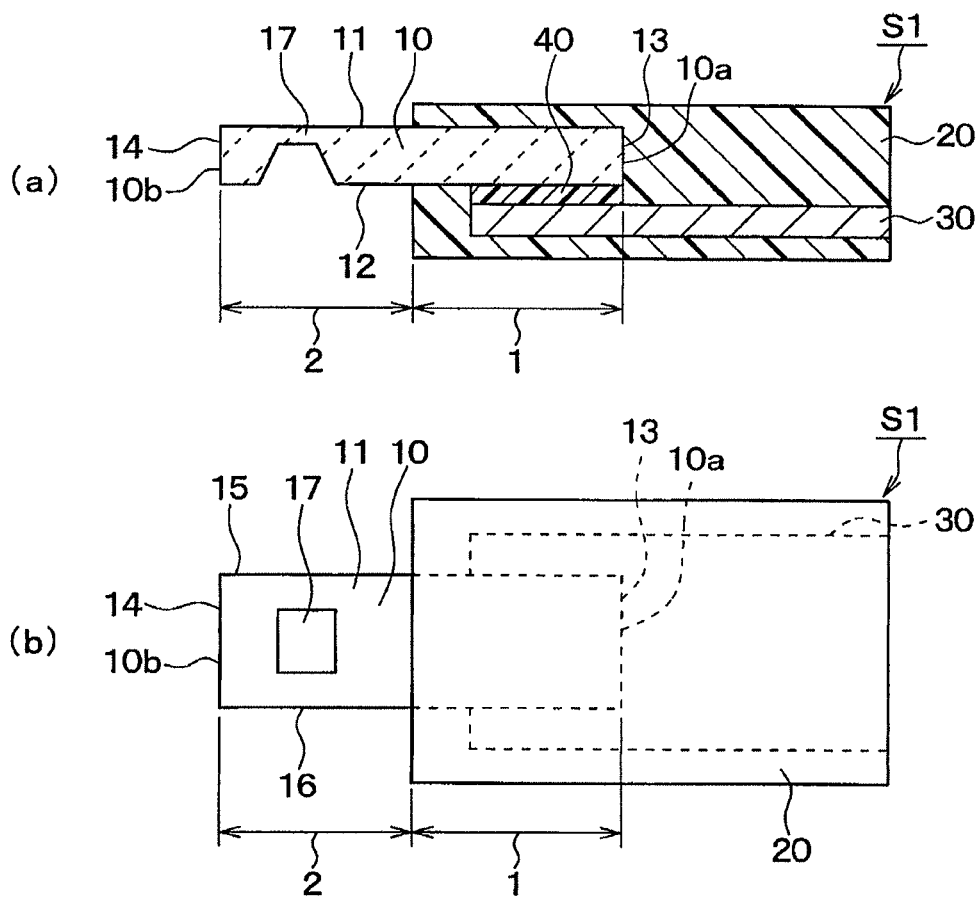
[FIG. 1] (a) is a schematic cross-sectional view of a semiconductor device according to a first embodiment of the present disclosure, and (b) is a schematic plan view of the semiconductor device shown in (a) when viewed from the top.

Hereinafter, embodiments of the present disclosure will be described with reference to the drawings. In the embodiments described hereinafter, like or equivalent parts will be designated, in the drawings, with like reference numbers to simplify the description.

(First Embodiment)

FIG. 1 is a diagram illustrating a schematic structure of a semiconductor device S1 according to a first embodiment of the present disclosure, in which (a) is a schematic cross-sectional view and (b) is a schematic plan view of (a) when viewed from the top. The semiconductor device S1 generally includes a semiconductor chip 10 having a plate shape and a resin 20 sealing a part of the semiconductor chip 10.

The semiconductor chip 10 has the plate shape. The semiconductor chip 10 is made of a silicon semiconductor or the like and is formed by a general semiconductor process or the like. In this case, the semiconductor chip 10 has a typical rectangular plate shape. Although not illustrated, the semiconductor chip 10 is provided with a diffusion wiring made by diffusing an impurity, a film made of an inorganic material such as SiN, $SiO_2$, and the like.

In this case, the semiconductor chip 10 has a rectangular plate shape that extends from one end 10a to the other end 10b (from the right to the left in FIG. 1). In regard to each of surfaces of the semiconductor chip 10, one of plate surfaces is referred to as a front surface 11 and the other of the plate surfaces is referred to as a rear surface 12. Also, four surfaces 13, 14, 15 and 16 connecting ends of the front surface 11 and the rear surface 12 are referred to as side surfaces 13, 14, 15 and 16.

In this case, the side surface 13 is the end surface 13 adjacent to the one end 10a, and the side surface 14 is the end surface 14 adjacent to the other end 10b. The side surfaces 15, 16 are two side surfaces 15, 16 extending between the ends 10a, 10b (extending in a chip longitudinal direction).

In this case, the semiconductor chip 10 is constructed as a sensor chip having a sensing portion 17 as a detecting portion. In particular, examples of the sensor chip are a pressure sensor having a diaphragm, an acceleration sensor and an angular velocity sensor, which have a movable part, and a thermal flow sensor. The sensing portion 17 is disposed on the front surface 11 of the semiconductor chip 10 adjacent to the other end 10b.

In this case, a recessed portion is formed on the rear surface 12 of the semiconductor chip 10, and thus a thin portion is formed adjacent to the front surface 11 of the semiconductor chip 10 as a bottom portion of the recessed portion. The sensing portion 17 is provided by the thin portion. The recessed portion is, for example, made by anisotropy-etching of silicon.

In particular, the sensing portion 17, which is provided by the thin portion, corresponds to a diaphragm for detecting a pressure, a movable part for detecting a physical quantity, a membrane including a thermal flow rate detecting element, or the like.

The semiconductor chip 10 is sealed with the resin 20 in such a state where the other end 10b of the semiconductor chip 10 including the sensing portion 17 is exposed from the resin 20 and the remaining part adjacent to the one end 10a is sealed within the resin 20. The resin 20 is a molded resin made of an epoxy resin or the like. The resin 20 is made by a transfer-molding using a mold, or the like.

The part of the semiconductor chip 10 that is adjacent to the one end 10a and being sealed within the resin 20 is referred to as a first part 1, and the part of the semiconductor chip 10 that is adjacent to the other end 10b than the first part 1, includes the sensing portion 17 and is exposed from the resin 20 is referred to as a second part 2. In the semiconductor chip 10, the sensing portion 17 is provided on the front surface 11 of the second part 2.

In the present embodiment, furthermore, the second part 2 of the semiconductor chip 10, which is adjacent to the other end 10b, projects from the resin 20. In the second part 2, the resin 20 does not exist outside of any of the front and rear surfaces 11 and 12 and all the side surfaces (three side surfaces in this case) 14, 15 and 16. That is, the resin 20 does not exist on any of outer surfaces of the second part 2.

In the present embodiment, since all the surfaces of the second part 2 including the sensing portion 17 are exposed from the resin 20, the sensing portion 17 is free from stress due to the resin 20. This structure enables accurate detection of the sensing portion 17.

The first part 1 of the semiconductor chip 10 is fixed to and supported by a substrate 30. In this case, the first part 1 of the semiconductor chip 10 is bonded to the substrate 30 through an adhesive 40 in a state where the rear surface 12 of the semiconductor chip 10 is opposed to the substrate 30. The adhesive 40 is, for example, made of an epoxy resin.

The substrate 30 is provided by a lead frame, a circuit board, or the like. The lead frame is made of a metal, such as Cu and 42-alloy, having excellent electric conductivity. The lead frame is made by etching or pressing. Examples of the circuit board are a printed circuit board, a ceramic board, and a flexible board. The first part 1 of the semiconductor chip 10 and the substrate 30 are sealed with the resin 20.

Although not illustrated, the semiconductor chip 10 and the substrate 30 are electrically connected through a bonding wire or the like, inside the resin 20. Although not illustrated, a part of the substrate 30 is provided as a terminal portion. The terminal portion of the substrate 30 is exposed from the resin 20 to be electrically connected to an external device. The part sealed with the resin 20 is protected from the outside.

Next, a manufacturing method of the semiconductor device of the present embodiment will be described. The manufacturing method includes a preparing step of preparing a plate-shaped semiconductor chip 10, a resin-sealing step of sealing the entirety of the semiconductor chip 10 with a resin 20, and a resin-removing step of removing the resin 20 by sublimation by applying a laser to the resin 20, thereby to expose the part of the semiconductor chip 10, that is, the above-described second part 2.

Figure 2:
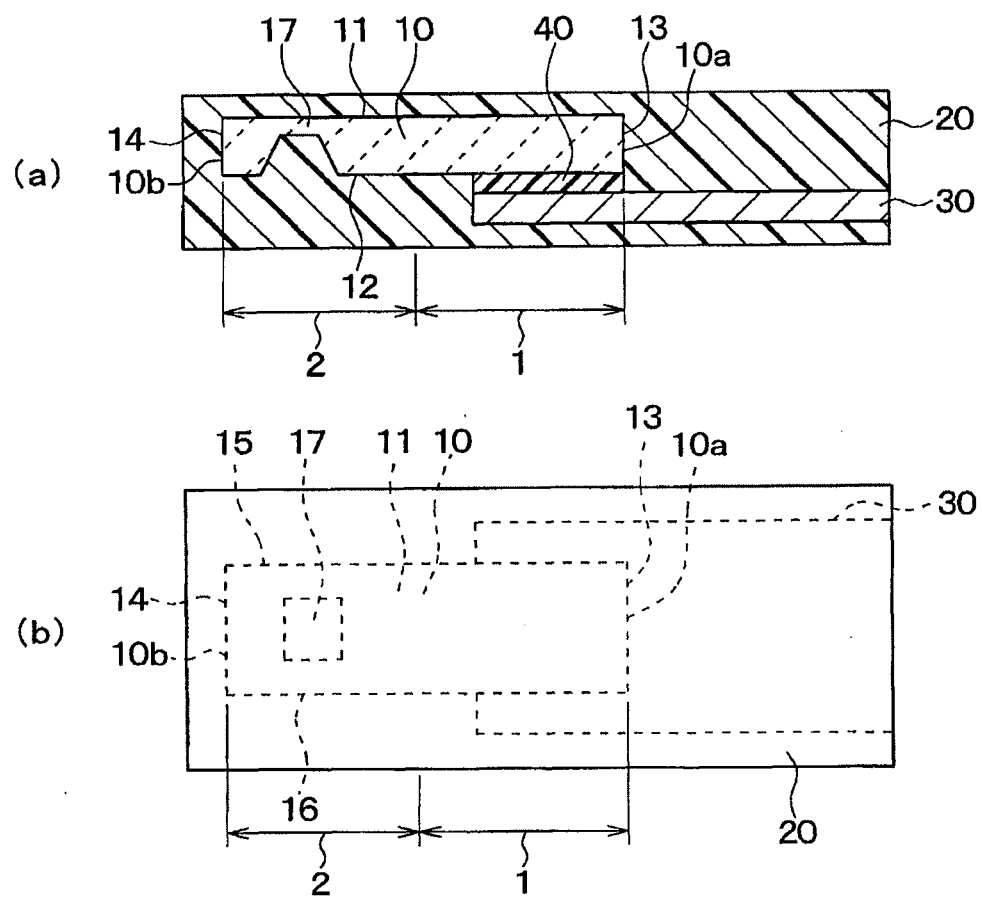
[FIG. 2] (a) is a schematic cross-sectional view illustrating a resin-sealing step of a manufacturing method of the semiconductor device according to the first embodiment, and (b) is a schematic plan view of (a)
Figure 3:
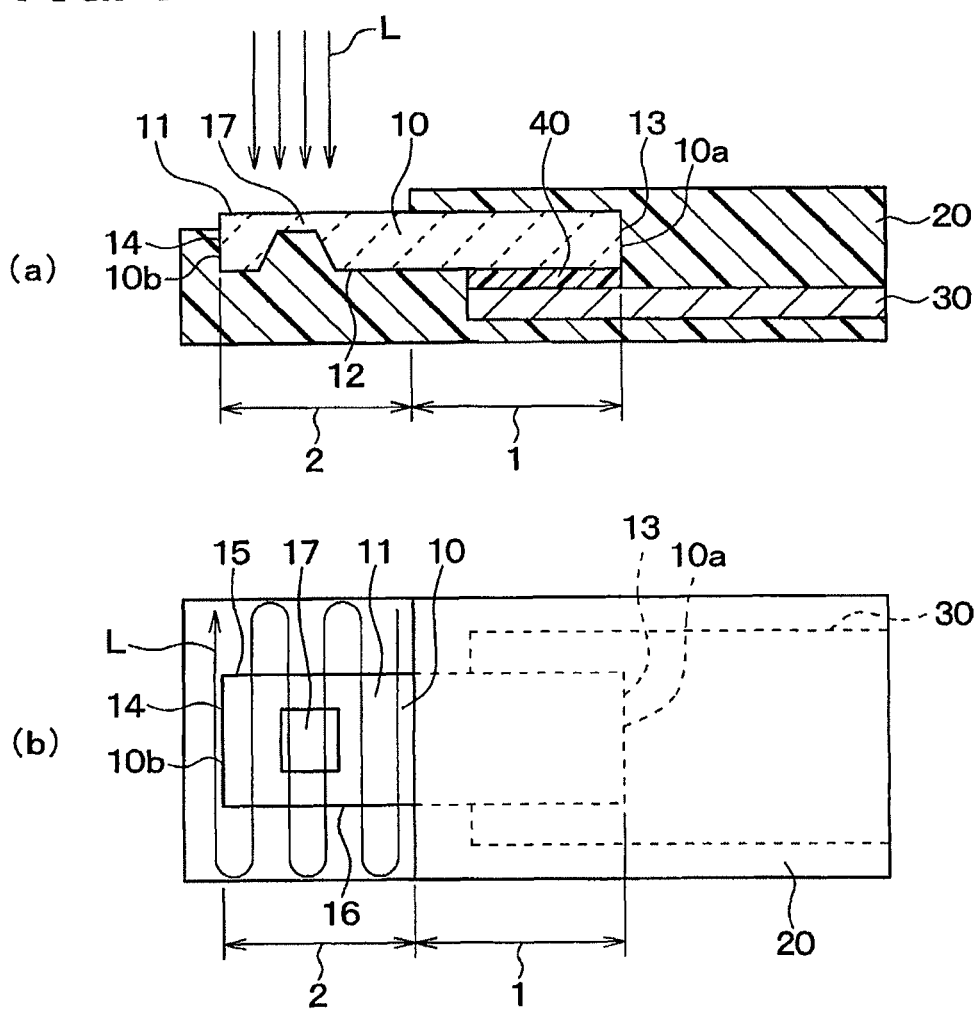
[FIG. 3] (a) is a schematic cross-sectional view illustrating a resin-removing step of the manufacturing method of the semiconductor device according to the first embodiment, and (b) is a schematic plan view of (a)
Figure 4:
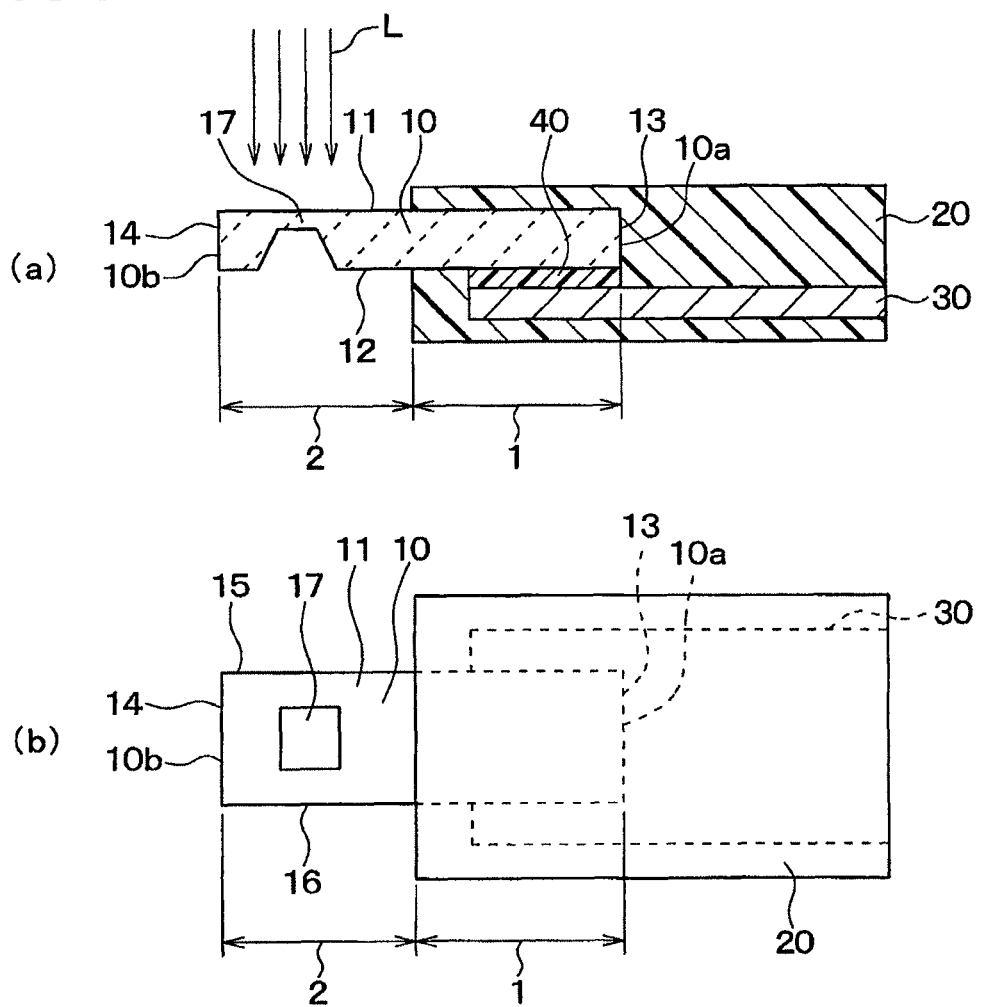
[FIG. 4] (a) is a schematic cross-sectional view illustrating the resin-removing step subsequent from (a) of FIG. 3, and (b) is a schematic plan view of (a)

FIG. 2 is a step diagram illustrating the resin-sealing step of the manufacturing method, FIG. 3 is a step diagram illustrating the resin-removing step of the manufacturing method, and FIG. 4 is a step diagram illustrating the subsequent resin-removing step from the step of FIG. 3. Further, in these FIGS. 2-4, (a) is a schematic cross-sectional view, and (b) is a schematic plan view of (a) when viewed from the top.

In the manufacturing method, a laser having a wavelength that can pass through the semiconductor chip 10 and has a lower absorptivity in the semiconductor chip 10 than in the resin 20 is selected and used as a laser L.

In particular, as the laser L, a laser having a wavelength greater than 1 μm, such as $CO_2$ (wavelength: approximately 10 μm), ErYAG (wavelength: approximately 3 μm), HoYAG (wavelength: approximately 1.5 μm), or a fiber laser, is used.

On the other hand, in the preparing step, as the semiconductor chip 10, a semiconductor chip made of a material that allows the laser L to pass through, has an absorptivity of the laser L lower than the resin 20, and is not melt by the laser L is prepared according to the laser L.

As described above, the semiconductor chip 10 of the present embodiment is produced by the semiconductor process. The semiconductor chip 10 has a body portion made of a silicon semiconductor, a diffusion wiring formed in the body portion, and a film made of an inorganic material, such as SiN or $SiO_2$. The semiconductor chip 10 has characteristics according to the above-described laser L.

In the manufacturing method, the semiconductor chip 10 is bonded to the substrate 30 through the adhesive 40. Thereafter, the semiconductor chip 10 and the substrate 30 are sealed with a resin. In this case, as shown in FIG. 2, the entirety of the semiconductor chip 10, that is, both of the first part 1 and the second part 2 are sealed with the resin 20 (resin-sealing step). This resin-sealing is performed by a technique using a mold, such as by a transfer molding technique.

Next, as shown in FIG. 3, the resin-removing step is performed by applying the laser having the wavelength that can pass through the semiconductor chip 10 and shows the lower absorptivity in the semiconductor chip 10 than in the resin 20, as the laser L. First, in the second part 2 of the semiconductor chip 10, the laser L is applied to the resin 20 from a side adjacent to the front surface 11 of the semiconductor chip 10, so that the resin 20 sealing the front surface 11 is sublimated and removed.

In the present embodiment, in this case, as shown by an arrow in (b) of FIG. 3, the laser L is scanned over the outline of the front surface 11 in the second part 2 of the semiconductor chip 10 to remove the resin 20 that seals the side surfaces 14-16 of the second part 2.

The application of the laser L is continued. When the resin 20 on the front surface 11 of the second part 2 is removed, the laser L passes through the semiconductor chip 10 to the rear surface 12. The application of the laser L is further continued to sublimate and remove the resin 20 that seals the rear surface 12 of the second part 2 by the laser L that has passed through the semiconductor chip 10 to the rear surface 12. In this case, the resin 20 is removed without damaging the semiconductor chip 10 by the laser L.

In particular, laser absorbing wavelength ranges of the silicon semiconductor, the diffusion wiring and the inorganic material of the semiconductor chip 10 are equal to or less than 1 um. The semiconductor chip 10 allows the laser in the wavelength range longer than 1 um almost to pass through without absorbing energy of the laser L. On the other hand, the resin 20 has absorption peaks in a long-wavelength range (e.g., vibration wavelength of —OH group≈3 um, vibration wavelength of SH group≈4 um, vibration wavelength of epoxy three-membered ring≈8 um), and can absorb the laser L in the wide wavelength range.

Therefore, when the laser L that has a long-wavelength (over 1 um) and a low-power density at a level of capable of removing the resin 20 (e.g., several tens mJ) is applied toward the front surface 11 of the semiconductor chip 10, the resin 20 on the periphery of the semiconductor chip 10 is selectively removed without damaging functions of the semiconductor chip 10.

In this way, in the resin-removing step of the present embodiment, the resin 20 disposed on the front surface 11 and the rear surface 12 of the part of the semiconductor chip 10 (the second part 2 in this case) is removed by applying the laser L, but the remaining part of the semiconductor chip 10 (the first part 1 in this case) is not applied with the laser L, and kept in the state of being sealed with the resin 20. When this resin-sealing step ends, the semiconductor device is finished.

In the present embodiment, when the resin 20 is removed from the second part 2 of the semiconductor chip 10 to expose the front and rear plate surfaces 11, 12 of the second part 2 of the semiconductor chip 10, the resin 20 on the rear surface 12 of the semiconductor chip 10 can also be removed only by applying the laser L from the side adjacent to the front surface 11 of the semiconductor chip 10.

Therefore, the resin 20 can be removed from both of the front and rear plate surfaces 11, 12 only by the application of the laser L from the side adjacent to the front surface 11, without applying the laser L from both sides of the front and rear plate surfaces 11, 12.

Note that, in the resin-removing step by the application of this laser, components of the resin 20 sublimated by the laser L is preferably exhausted by making an ambient of the work to a reduced-pressure atmosphere using a vacuum pump in a state where the work is kept in a vacuum chamber or the like.

(Second Embodiment)

Figure 5:
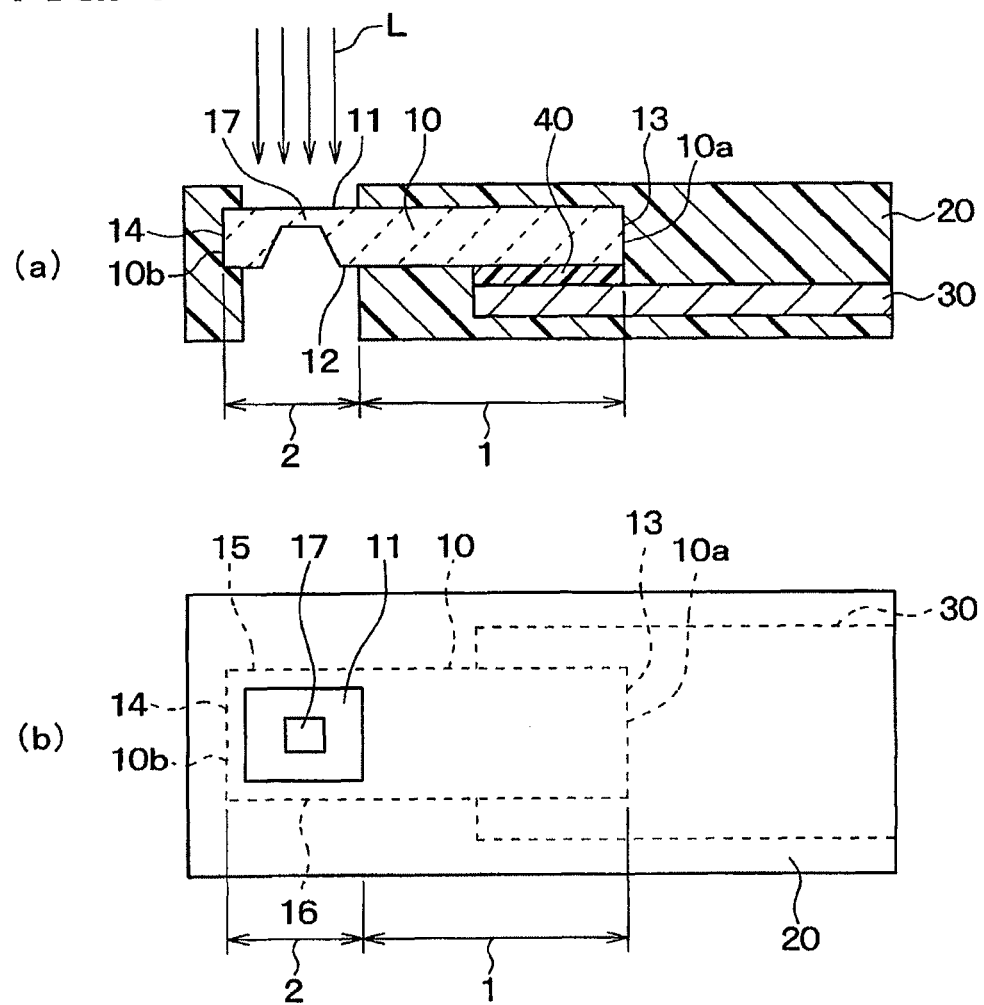
[FIG. 5] (a) is a schematic cross-sectional view illustrating a resin-removing step of a manufacturing method of a semiconductor device according to a second embodiment of the present disclosure, and (b) is a schematic plan view of (a)

FIG. 5 is a step diagram illustrating a resin-removing step of a manufacturing method of a semiconductor device according to a second embodiment of the present disclosure, in which (a) is a schematic cross-sectional view, and (b) is a schematic plan view of (a) when viewed from the top. In FIG. 5, a state where the removal of the resin 20 is finished is illustrated. In the present embodiment, a removal area of the resin 20 sealing the second part 2 is different from that of the first embodiment, and thus the difference will be mainly described.

In the first embodiment, the resin 20 does not exist outside the front and rear surfaces 11, 12 and all the side surfaces 14, 15 and 16 of the second part 2 of the semiconductor chip 10. In the present embodiment, on the other hand, the resin 20 is removed so that portions of the front and rear surfaces 11, 12 of the second part 2 of the semiconductor chip 10 including the sensing portion 17 are exposed, as shown in FIG. 5.

In the present embodiment, in the second part 2, the portions of the front and rear surfaces 11, 12 outside the sensing portion 17 and the three side surfaces 14-16 connecting the ends of the front and rear surfaces 11, 12 including the end surface 14 adjacent to the other end 10b (that is, all the side surfaces 14-16) are kept as being sealed with the resin 20.

Such a removing shape of the resin 20 of the present embodiment is easily realized by scanning the laser L in the area corresponding to the exposed area of FIG. 5 in the resin-removing step, after the resin-sealing step of sealing the entirety of the semiconductor chip 10 is performed, in the manner similar to the above.

(Third Embodiment)

Figure 6:
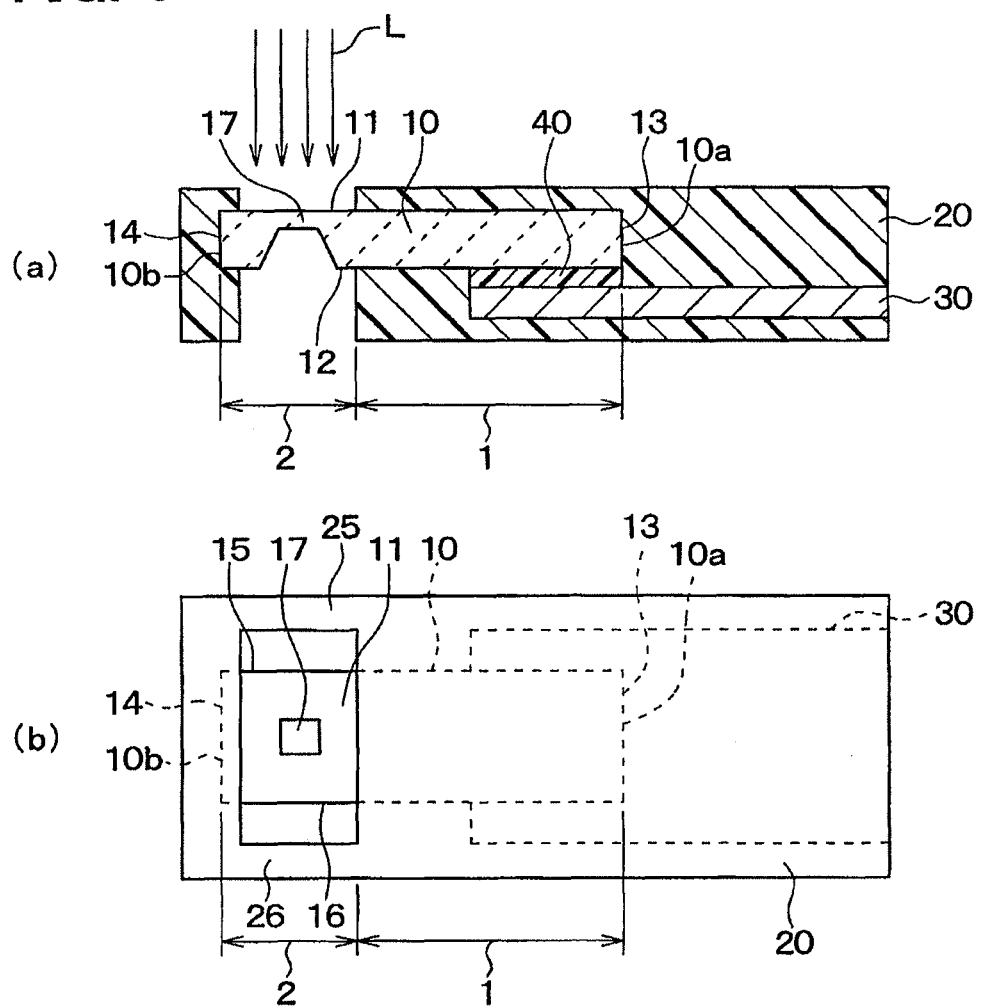
[FIG. 6] (a) is a schematic cross-sectional view illustrating a resin-removing step of a manufacturing method of a semiconductor device according to a third embodiment of the present disclosure, and (b) is a schematic plan view of (a)

FIG. 6 is a step diagram illustrating a resin-removing step of a manufacturing method of a semiconductor device according to a third embodiment of the present disclosure, in which (a) is a schematic cross-sectional view, and (b) is a schematic plan view of (a) when viewed from the top. In FIG. 6, a state where the removal of the resin 20 is finished is illustrated. In the present embodiment, a removal area of the resin 20 sealing the second part 2 is different from that of the first embodiment, and thus the difference will be mainly described.

In the present embodiment, as shown in FIG. 6, the resin 20 is removed so that portions of the front and rear surfaces 11, 12 of the second part 2 of the semiconductor chip 10 including the sensing portion 17 are exposed.

In this case, further, in the exposed portions of the front and rear surfaces 11, 12, the two side surfaces 15, 16 connecting the front and rear surfaces 11, 12 are opposed to opposed portions 25, 26 of the resin 20 across clearances and exposed into the clearances.

The opposed portions 25, 26 are portions of the resin 20, and are formed as portions extending from the resin 20 sealing the first part 1. In the present embodiment, in the second part 2, portions of the front and rear surfaces 11, 12 adjacent to the end surface 14 of the other end 10b and the end surface 14 are kept as being sealed with the resin 20.

Such a removing shape of the resin 20 of the present embodiment is easily realized by scanning the laser L in the area corresponding to the exposed area of FIG. 6 in the resin-removing step, after the resin-sealing step of sealing the entirety of the semiconductor chip 10 is performed, in the manner similar to the above.

In particular, in the resin-removing step, the resin 20 on the two side surfaces 15, 16 of the second part 2 of the semiconductor chip 10 is removed, while remaining portions of the resin 20, by the laser L applied to the front surface 11 of the semiconductor chip 10, so that the two side surfaces 15, 16 are exposed in the state where the two side surfaces 15, 16 and the opposed portions 25, 26 of the resin 20 are opposed across the clearances.

Further in detail, the laser L is applied to the front surface 11 of the second part 2 of the semiconductor chip 10 to remove the resin 20 on the front and rear surfaces 11, 12. Also, the application range of the laser L is expanded to a range over the boundary between the two side surfaces 15, 16 and the resin 20 that is opposed to and sealing the side surfaces 15, 16, so as to remove the resin 20 from the vicinity of the boundary.

In the present embodiment, in the second part 2 of the semiconductor chip 10, the two side surfaces 15, 16 are exposed, in addition to the front and rear surfaces 11, 12. However, the two side surfaces 15, 16 are protected from the opposed portions 25, 26 of the resin 20, which are opposed to the two side surfaces 15, 16 across the clearances, without receiving the stress from the resin 20.

In a case where the resin 20 including the opposed portions 25, 26 as the present embodiment is molded using a mold, it is necessary to separately mold the sealing portion and the opposed portions. Namely, after the molding for sealing the first part 1 with the resin 20 is performed, the opposed portions 25, 26 are molded in the second part 2. In the present embodiment, on the other hand, since the laser L is used, the resin-molding is performed one time.

In the case of molding using the mold, it is necessary to interpose a film to ensure removability of the mold after the molding or to ensure adhesion between the mold and the work. In this case, therefore, it is difficult to make the clearances between the opposed portions 25, 26 and the semiconductor chip 10 small. On the other hand, in the case of removing the resin 20 by the laser L, it is possible to make the clearances fine dimensions. Therefore, an advantageous effect, such as reduction in size of the device, is expected.

As described above, in the semiconductor device of the present embodiment, the resin 20 is provided with the opposed portions 25, 26 that are opposed to the two side surfaces 15, 16 of the second part 2 of the semiconductor chip 10. The opposed potions 25, 26 are provided by portions extending from the resin 20 of the first part 1 toward the second part 2

In such a semiconductor device, the semiconductor chip 10 is, for example, used to detect a flow rate of gas. In this case, the opposed portions 25, 26 can be configured as rectifiers for the flow of gas. Further, the semiconductor device may not be limited to such a flow sensor, but may be a pressure sensor, an acceleration sensor and the like, as described above.

(Fourth Embodiment)

Figure 7:
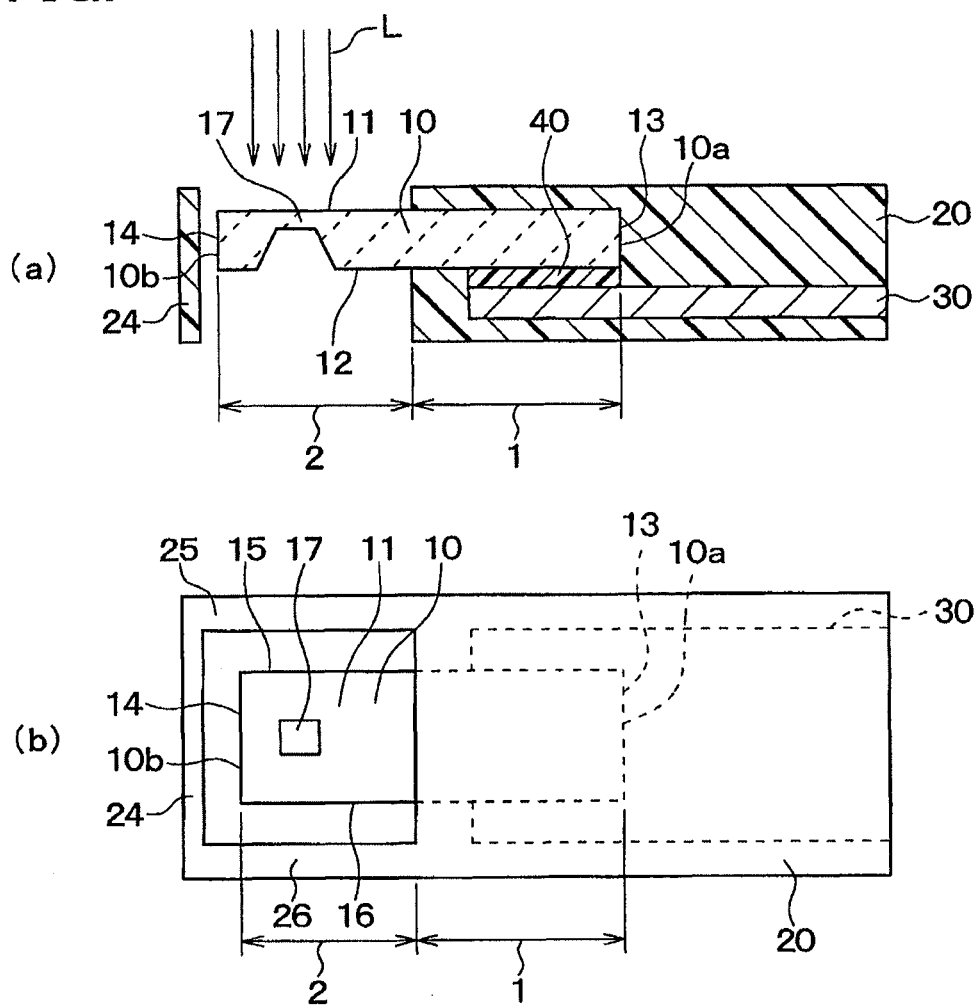
[FIG. 7] (a) is a schematic cross-sectional view illustrating a resin-removing step of a manufacturing method of a semiconductor device according to a fourth embodiment of the present disclosure, and (b) is a schematic plan view of (a)

FIG. 7 is a step diagram illustrating a resin-removing step of a manufacturing method of a semiconductor device according to a fourth embodiment of the present disclosure, in which (a) is a schematic cross-sectional view, and (b) is a schematic plan view of (a) when viewed from the top. In FIG. 7, a state where the removal of the resin 20 is finished is illustrated. In the present embodiment, a removal area of the resin 20 sealing the second part 2 is different from that of the above-described first embodiment, and thus the difference will be mainly described.

Also in the semiconductor device of the present embodiment, similar to the above-described first embodiment, the front and rear surfaces 11, 12 and all of the side surfaces 14-16 of the second part 2 of the semiconductor chip 10 are exposed, as shown in FIG. 7. Further, the resin 20 has opposed portions 24, 25, 26 that are respectively opposed to the side surfaces 14-16 across a clearance.

In particular, the resin 20 has the opposed portion 24 opposed to the end surface 14 of the other end 10b of the semiconductor chip 10 in the second part 2, and the opposed portions 25, 26 opposed to the two side surfaces 15, 16 extending between the end 10a and the end 10b in the second part 2.

These opposed portions 24-26 are formed as portions extending from the resin 20 sealing the first part 1. In this case, the opposed portions 24-26 are formed into a rectangular frame shape that is integral with the resin 20 sealing the first part 1 and surrounds the second part 2.

In the resin-removing step of the present embodiment, the resin 20 on the three side surfaces 14-16 of the second part 2 of the semiconductor chip 10 is removed by the laser L applied toward the front surface 11 of the semiconductor chip 10, while remaining portions of the resin 20, so that the three side surfaces 14-16 are exposed in the state where the three side surfaces 14-16 and the opposed portions 24-26 of the resin 20 are opposed to each other across the clearance.

In particular, the laser L is applied to the front surface 11 of he second part 2 of the semiconductor chip 10 to remove the resin 20 disposed on the front and rear surfaces 11, 12. Further, the application range of the laser L is increased to a range over the boundary between the three side surfaces 14-16 and the resin 20 that is opposed to and sealing the side surfaces 14-16 so as to remove the resin 20 from the vicinity of the boundary.

In the present embodiment, all the outer surfaces of the second part 2 of the semiconductor chip 10 are exposed. However, the three side surfaces 14-16 are protected from the opposed portions 24-26 of the resin 20, which are opposed to the side surfaces 14-16 across the clearance, without receiving the stress from the resin 20.

Also in the present embodiment, similar to the third embodiment, the resin 20 including the opposed portions 24-26 is formed by a resin-molding in one time, and it is possible to make the clearance of the opposed portions 24-26 fine dimension. Further, similar to the above, the opposed portions 24-26 can be used as the rectifier or the like.

(Fifth Embodiment)

Figure 8:
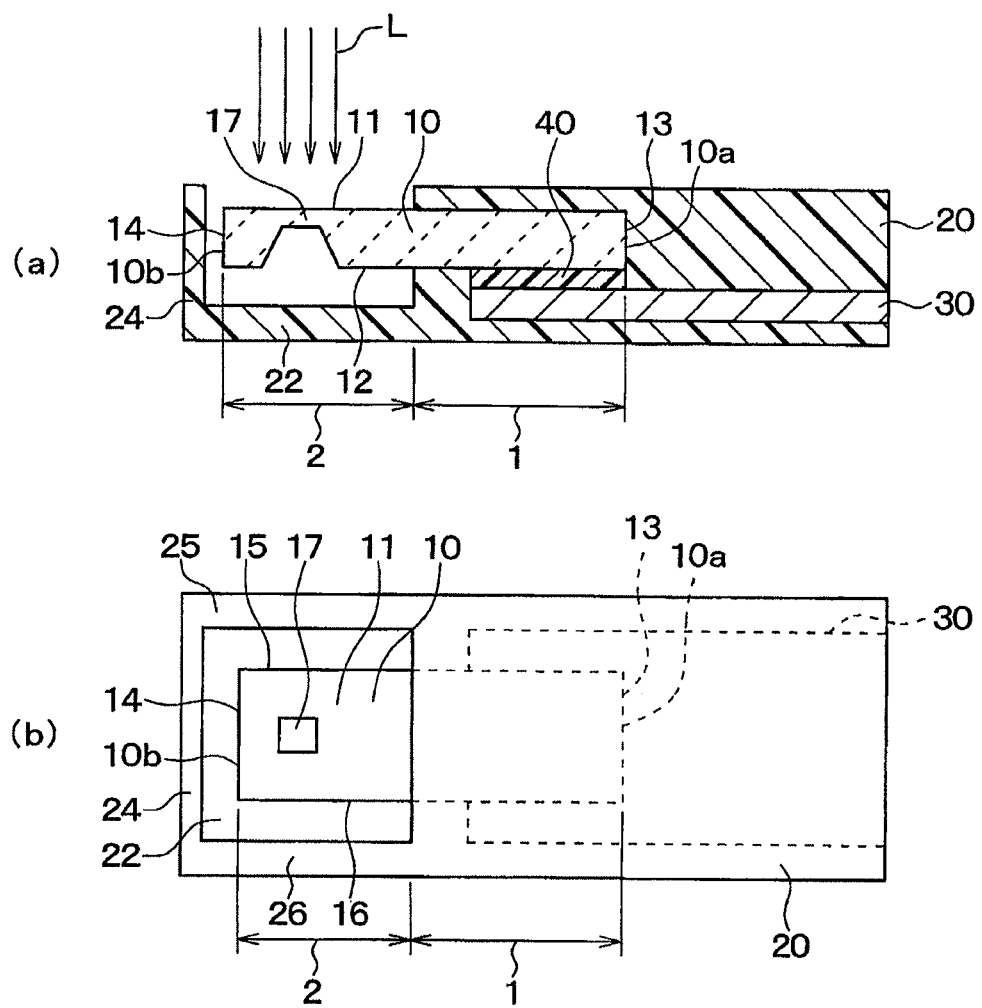
[FIG. 8] (a) is a schematic cross-sectional view illustrating a resin-removing step of a manufacturing method of a semiconductor device according to a fifth embodiment of the present disclosure, and (b) is a schematic plan view of (a)

FIG. 8 is a step diagram illustrating a resin-removing step of a manufacturing method of a semiconductor device according to a fifth embodiment of the present disclosure, in which (a) is a schematic cross-sectional view, and (b) is a schematic plan view of (a) when viewed from the top. In FIG. 8, a state where the removal of the resin 20 is finished is illustrated. In the present embodiment, a removal area of the resin 20 sealing the second part 2 is different from that of the above-described first embodiment, and thus the difference will be mainly described.

In the semiconductor device of the present embodiment, as shown in FIG. 8, the resin 20 has an opposed portion 22 that is opposed to the rear surface 12 of the second part 2 of the semiconductor chip 10 across a clearance, in addition to the structure of the above-described fourth embodiment. In this case, the four opposed portions 22, 24-26 are integral with each other, and form a rectangular parallelepiped-shaped space. Therefore, hereinafter, a difference from the above-described fourth embodiment will be mainly described.

In the semiconductor device, the opposed portions 22, 24-26 extending from the resin 20 sealing the first part 1 are disposed to be spaced from all of the outer surfaces 12, 14-16 of the second part 2 of the semiconductor chip 11 other than the front surface 11. The opposed portions 24-26 opposed to the side surfaces 14-16 are formed by the resin-removing step similar to the above-described fourth embodiment.

In the resin-removing step of the present embodiment, further, in the second part 2 of the semiconductor chip 10, the resin 20 disposed on the rear surface 12 is removed, while remaining a part of the resin 20, by the laser L that passes through the semiconductor chip 10 to the rear surface 12, so that the rear surface 12 of the semiconductor chip 10 is exposed in the state of being opposed to the resin 20 across a clearance.

In this case, in particular, to remove the resin 20 disposed on the rear surface 12 of the second part 2 of the semiconductor chip 10, a relationship between the depth to remove the resin 20 by the application of the laser L and the application time is calculated. The application time is controlled based on this relationship, so that the part of the resin 20 on the rear surface 12 remains.

In the present embodiment, the effects similar to the fourth embodiment described above will be achieved in regard to the side surfaces 14-16. Also, the rear surface 12 of the second part 2, which is exposed and opposed to the opposed portion 22 of the resin 20 across the clearance, is protected by the opposed portion 22 without receiving the stress from the resin 20. Similar to the effects described above, the molding of the resin 20 can be made by the molding of one time, the clearance can be made to a fine dimension, and the opposed portions can be used as rectifiers.

(Sixth Embodiment)

Figure 9:
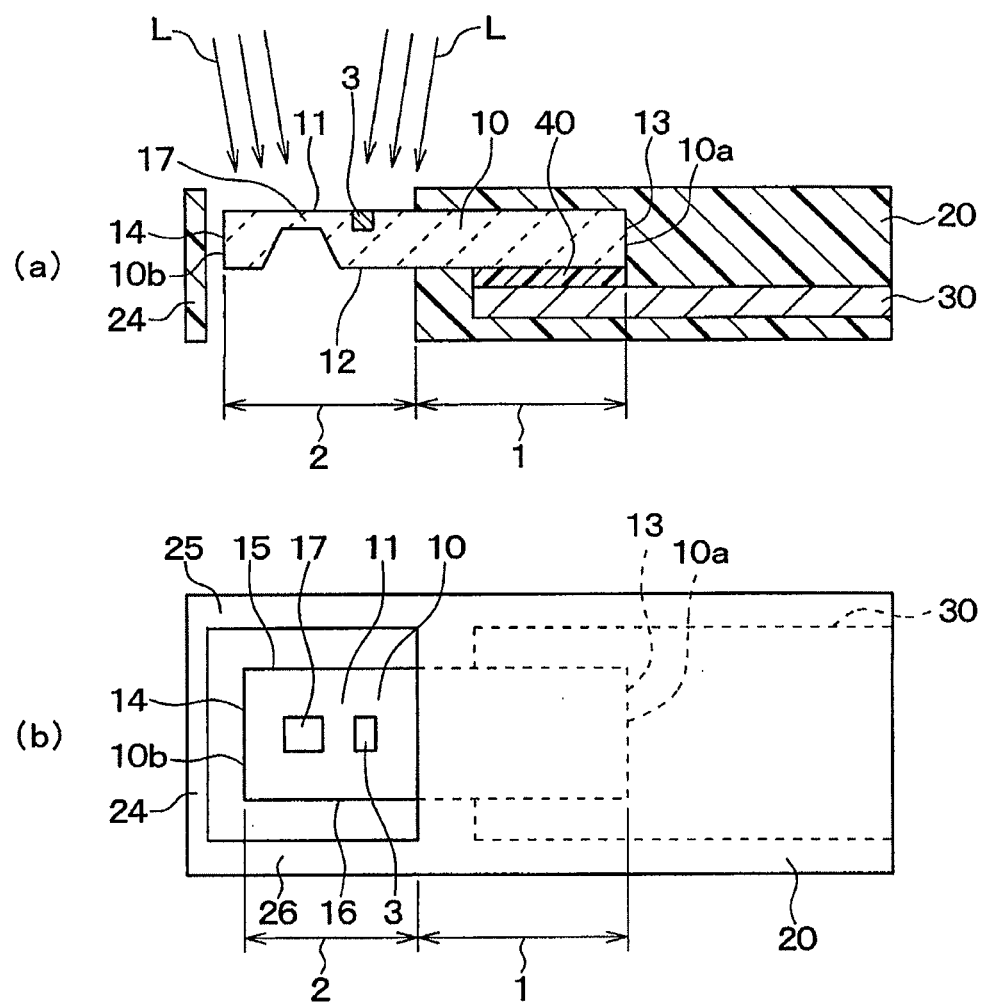
[FIG. 9] (a) is a schematic cross-sectional view illustrating a resin-removing step of a manufacturing method of a semiconductor device according to a sixth embodiment of the present disclosure, and (b) is a schematic plan view of (a)

FIG. 9 is a step diagram illustrating a resin-removing step of a manufacturing method of a semiconductor device according to a sixth embodiment of the present disclosure, in which (a) is a schematic cross-sectional view, and (b) is a schematic plan view of (a) when viewed from the top. In FIG. 9, a state where the removal of the resin 20 is finished is illustrated. In the present embodiment, a structure of the semiconductor chip 10 is different from that of each of the above-described embodiments. With this, a method of applying the laser L is different from that of each of the above-described embodiments. Hereinafter, these differences will be mainly described.

In each of the embodiments described above, the film and the wiring of the semiconductor chip 10 are made of the diffusion wiring and the inorganic substance. In such a semiconductor chip 10, characteristics, such as the transmittance of the laser L, the absorptivity of the laser L lower than the resin 20, and the non-melting property relative to the laser L, are realized.

On the other hand, in the semiconductor chip 10 of the present embodiment, a metal wiring 3 that is made of a metallic material to reflect the laser L is arranged on the second part 2 that is exposed by removing the resin 20. Such a metal wiring 3 is, for example, made of aluminum or gold, and reflects a laser L having a wavelength of approximately several um.

In this case, if the laser L is applied from a position immediately above the front surface 11 of the second part 2, similar to the resin-removing step of each of the embodiments described above, the resin 20 that is located immediately under the metal wiring 3 on the rear surface 12 is shielded by the metal wiring 3. Since the resin 20 located immediately under the metal wiring 3 is not applied with the laser L, and thus is not removed.

In the resin-removing step of the present embodiment, as shown in FIG. 9, the laser L is applied from a position diagonally above the metal wiring 3, so that the resin 20 that is located immediately under the metal wiring 3 on the rear surface 12 can be applied with the laser L. As such, also in the present embodiment, the resin 20 sealing the rear surface 12 of the second part 2 can be suitably removed.

(Seventh Embodiment)

Figure 10:
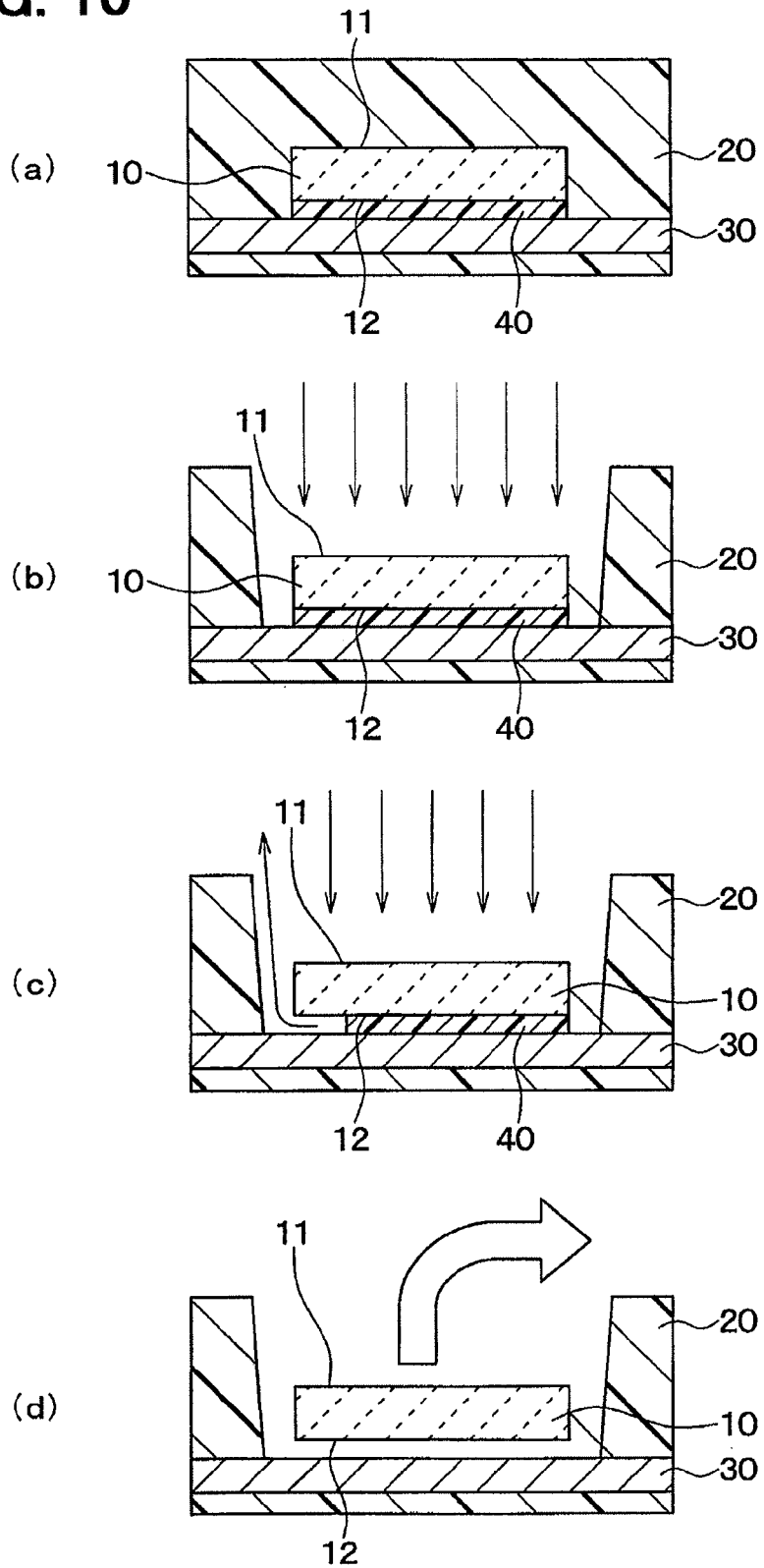
[FIG. 10] (a) to (d) are views illustrating a resin-sealing step and a resin-removing step of a manufacturing method of a semiconductor device according to a seventh embodiment of the present disclosure.

FIG. 10 is a step diagram illustrating a resin-sealing step and a resin-removing step of a manufacturing method of a semiconductor device according to a seventh embodiment of the present disclosure, in which (a)-(d) are schematic cross-sectional views of the work in each step.

In each of the embodiments described above, the resin-removing step is performed to expose a part of the semiconductor chip 10. In the present embodiment, a resin-removing step is performed to expose the entirety of the semiconductor chip 10 that is entirely sealed with a resin.

The present embodiment is applied to a case where, in a semiconductor device in which the semiconductor chip 10 is entirely sealed with the resin 20, a malfunction occurs in a finished product and only the semiconductor chip 10 needs to be removed from the resin 20 and to be inspected for analysis of the malfunction. In particular, the present embodiment is applied to a manufacturing method of a semiconductor device that includes such a removing step of the semiconductor chip 10 and an inspecting step, as parts of the manufacturing method.

Also in the resent embodiment, as shown in (a) of FIG. 10, the semiconductor chip 10 is firstly fixed to the substrate 30 with the adhesive 40, and the semiconductor chip 10 and the substrate 30 are then sealed with a resin so that the entirety of the semiconductor chip 10 is sealed with the resin 20 (resin-sealing step).

In this case, the adhesive 40 made of a resin is disposed between the substrate 30 and the rear surface 12 of the semiconductor chip 10, and the other surfaces, that is, the front surface and all the side surfaces of the semiconductor chip 10 are sealed with the resin. In this case, the adhesive 40 is made of a typical epoxy resin, which is the same system of the resin 20, and the adhesive 40 corresponds to the resin sealing the rear surface 12 of the semiconductor chip 10.

Further, in the resin-removing step, as shown in (b) of FIG. 10, the laser L is applied from a side to the front surface 11, in the entire part of the semiconductor chip 10. By this application of the laser L, the resin 20 disposed on the front surface 11 is removed, and the resin 20 sealing the side surfaces 14-16 is also removed.

Further, as shown in (c) of FIG. 10, the application of the laser L is continued, so that the adhesive 40 as the resin sealing the rear surface 12 is sublimated and removed by the laser L passing through the semiconductor chip 10 to the rear surface 12 of the semiconductor chip 10. Also in this case, similar to the above, the removing of the resin 20 is performed without damaging the semiconductor chip 10 by the laser L. The resin-removing step of the present embodiment is described hereinabove.

When the resin-removing step finishes, as shown in (d) of FIG. 10, the semiconductor chip 10 is in a state where all the outer surfaces are exposed from the resin 20. Thereafter, the semiconductor chip 10 is removed, and the inspection is performed in the similar manner as described above. As described above, also in the case of exposing all the surfaces of the semiconductor chip 10, all the surfaces including the rear surface 12 can be exposed only by applying the laser only toward the front surface 11.

(Reference Example)

Figure 11:
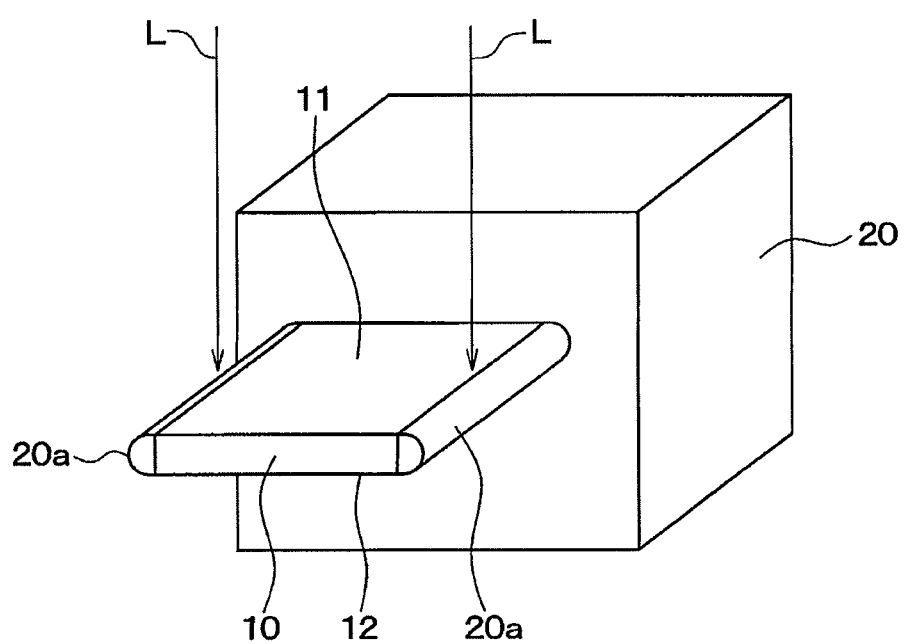
[FIG. 11] is a schematic perspective view illustrating a resin-removing step of a manufacturing method of a semiconductor device as a reference example of the present disclosure.

FIG. 11 is a schematic perspective view illustrating a resin-removing step of a manufacturing method of a semiconductor device, as a reference example of the present disclosure. In this example, the semiconductor device includes a plate-shaped semiconductor chip 10 and a resin 20 that seals a part of the semiconductor chip 10 and exposes the remaining part of the semiconductor chip 10, similar to those of the first embodiment described above.

In this example, a resin-molding is performed using a mold that tightly contacts and covers the remaining part of the semiconductor chip 10 exposing from the resin 20 and positions the part of the semiconductor chip 10 in a cavity. When the remaining part of the semiconductor chip 10 is covered with the mold, a film is generally disposed between the semiconductor chip 10 and the mold so as to ensure the tightness.

In such a molding, the mold has a complex shape, as compared with a mold used for molding the entirety of the semiconductor chip 10 with the resin 20. The mold having the complex shape and the film are necessary, and there is a fear that the manufacturing costs increase.

In this case, although the remaining part of the semiconductor chip 10 is covered with the mold, a clearance is likely to exist on the side surface of the semiconductor chip 10. As shown in FIG. 11, therefore, there is a possibility that the resin adheres to the side surface, and causes a resin burr 20a. This example aims to remove the resin burr 20a by applying a laser and to expose the side surface.

In particular, as shown in FIG. 11, in the remaining part of the semiconductor chip 10 exposing from the resin 20, the laser L is applied to the resin burr 20a formed on the side surface of the semiconductor chip 10 from the side adjacent to the front surface 11 to remove the resin burr 20a by sublimation.

In this case, to sufficiently remove the resin burr 20a on the side surface of the semiconductor chip 10, the laser L is applied focusing on the outline of the front surface 11 of the semiconductor chip 10. However, it is difficult to avoid the laser L from being applied to the semiconductor chip 10.

Also in this case, therefore, the relationship between the laser L and the semiconductor chip 10 is set so that the laser L passes through the semiconductor chip 10, the absorptivity of the laser L is higher in the resin 20 than in the semiconductor chip 10, and the semiconductor chip 10 is not melt by the laser L, similar to the first embodiment described above.

Therefore, even if the laser L focusing on the resin burr 20a is applied to the semiconductor chip 10, it is less likely that the semiconductor chip 10 will be damaged due to the application of the laser L. By the resin-removing step performed by applying the laser of this example, in FIG. 11, the semiconductor device from which the resin burr 20a has been properly removed is produced.

(Other Embodiment)

The semiconductor chip 10 may be made of SiC, a germanium semiconductor or the like, other than the one made of the silicon semiconductor. Also in such a case, the relationship with the laser L may be set in the similar manner.

The semiconductor chip 10 may be partly or entirely exposed by removing the resin 20. In the case where a part of the semiconductor chip 10 is exposed, it is not always necessary that the exposed portion is the sensing portion 17. For example, a heat generating portion in which a power element is disposed may be exposed in order to radiate heat. The purpose of entirely exposing the semiconductor chip 10 may not be limited to the one for the analysis of the malfunction, as described above.

Electronic elements or circuit chips may be mounted on the substrate 30 within the resin 20, in addition to the semiconductor chip 10. In such a case, the electronic elements or circuit chips may be connected to the semiconductor chip 10 through bonding wires within the resin 20.

In FIG. 6, in the exposed portions of the front and rear surfaces 11, 12 of the semiconductor chip 10, the two side surfaces 15, 16 are opposed to the opposed portions 25, 26 of the resin 20 across the clearances, and are exposed into the clearances. Alternatively, one of the two side surfaces 15, 16 may be kept as being sealed with the resin 20, and the other of the two side surfaces 15, 16 may be exposed into the clearance defined between the side surface and the opposed portion.

As a modification of the structure of the resin 20 shown in FIG. 8, for example, the opposed portion of the resin 20 may be only the opposed portion 22 that is opposed to the rear surface of the second part of the semiconductor chip 10 across the clearance, and the opposed portions opposed to the side surfaces 14, 15, 16 of the second part 2 of the semiconductor chip 10 may be removed by the laser L.

The embodiments described above may be suitably combined in various ways, in addition to the combinations as described above.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A method of manufacturing a semiconductor device, the method comprising:
    preparing a semiconductor chip having a plate shape;
    sealing the entirety of the semiconductor chip with the resin; and
    sublimating and removing the resin by applying a laser to the resin to expose at least a part of the semiconductor chip, wherein
    in the preparing, a semiconductor chip made of a material that has a lower absorptivity of the laser than the resin and is not melted by the laser is prepared as the semiconductor chip,
    in the sublimating and removing, a laser having a wavelength that passes through the semiconductor chip and has a lower absorptivity in the semiconductor chip than in the resin is applied as the laser, the laser is applied to the resin-from a side adjacent to one of plate surfaces of the semiconductor chip so that the resin sealing the one of the plate surfaces is sublimated and removed, and the laser is subsequently applied to pass through the semiconductor chip to the other of the plate surfaces of the semiconductor chip so that at least a part of the resin sealing the other of the plate surfaces is sublimated and removed.

2. The manufacturing method of the semiconductor device according to claim 1, wherein
    in the sublimating and removing, the resin is removed from the one of the plate surfaces and the other of the plate surfaces in a part of the semiconductor chip by the applying of the laser, and a remaining part of the semiconductor chip is not applied with the laser and is maintained as being sealed with the resin.

3. The manufacturing method of the semiconductor device according to claim 2, wherein
    in the sublimating and removing, in the part of the semiconductor chip, the resin disposed on at least one of side surfaces of the semiconductor chip is removed, while remaining a portion, by the laser applied from the side adjacent to the one of the plate surfaces of the semiconductor chip, so that the at least one of side surfaces of the semiconductor chip is exposed in a state of being opposed to the resin across a clearance.

4. The manufacturing method of the semiconductor device according to claim 2, wherein
    in the sublimating and removing, in the part of the semiconductor chip, the resin disposed on the other of the plate surfaces is removed, while remaining a portion, by the laser that has passed through the semiconductor chip to the other of the plate surfaces, so that the other of the plate surfaces is exposed in a state of being opposed to the resin across a clearance.

5. The manufacturing method of the semiconductor device according to claim 2, wherein
    in the sublimating and removing, in the part of the semiconductor chip, the one of the plate surface and the other of the plate surfaces are located on different sides of the semiconductor.

6. The manufacturing method of the semiconductor device according to claim 2, wherein
    in the sublimating and removing, the laser is subsequently applied to the one side of the semiconductor and passes through the one side of the semiconductor to remove resin from the other side of the semiconductor layer.

7. A method for manufacturing a semiconductor device, the method comprising:
    completely sealing a semiconductor chip with a resin, the semiconductor chip having a plate shape and an absorptivity, and the semiconductor chip including a first side and a second side different from the first side; and
    applying a laser to remove at least a part of the resin surrounding the first side and at least part of the resin surrounding the second side so that the semiconductor chip is at least partially exposed on both the first side and the second side, wherein
    a wavelength of the laser has a high transmittance in the semiconductor chip and a lower absorption rate in the semiconductor chip than the resin.

8. The method of claim 7, further comprising
    applying the laser to the first side of the semiconductor chip so that the laser travels through the semiconductor device from the first side to the second side and that the laser removes the resin surrounding the second side.

\* \* \* \* \*